(12) United States Patent
Sunshine et al.

(10) Patent No.: US 10,756,020 B2
(45) Date of Patent: *Aug. 25, 2020

(54) FABRIC-BASED ITEMS WITH ELECTRICAL COMPONENT ARRAYS

(71) Applicant: Apple Inc., Cupertino, CA (US)

(72) Inventors: Daniel D. Sunshine, Sunnyvale, CA (US); Paul S. Drzaic, Morgan Hill, CA (US); Daniel A. Podhajny, San Jose, CA (US); David M. Kindlon, Felton, CA (US); Hoon Sik Kim, San Jose, CA (US); Kathryn P. Crews, Menlo Park, CA (US); Yung-Yu Hsu, San Jose, CA (US)

(73) Assignee: Apple Inc., Cupertino, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/584,537

(22) Filed: Sep. 26, 2019

(65) Prior Publication Data

US 2020/0020639 A1   Jan. 16, 2020

Related U.S. Application Data

(63) Continuation of application No. 15/752,480, filed as application No. PCT/US2016/047259 on Aug. 17, 2016, now Pat. No. 10,553,540.
(Continued)

(51) Int. Cl.
*H01L 29/18* (2006.01)
*H01L 23/538* (2006.01)
(Continued)

(52) U.S. Cl.
CPC ......... *H01L 23/5387* (2013.01); *D02G 3/441* (2013.01); *G01D 11/30* (2013.01);
(Continued)

(58) Field of Classification Search
CPC ...... H01L 23/5387; H01L 33/62; D02G 3/441
See application file for complete search history.

(56) References Cited

U.S. PATENT DOCUMENTS 7,144,830 B2 * 12/2006 Hill ........................ H05K 1/038
442/205
7,531,203 B2   5/2009 Tao et al.
(Continued)

FOREIGN PATENT DOCUMENTS

CN        101185175 A    5/2008
CN        101827967 A    9/2010
(Continued)

*Primary Examiner* — Didarul A Mazumder
*Assistant Examiner* — Wasiul Haider
(74) *Attorney, Agent, or Firm* — Treyz Law Group, P.C.; G. Victor Treyz; Joseph F. Guihan

(57) ABSTRACT

A fabric-based item may include fabric layers and other layers of material. An array of electrical components may be mounted in the fabric-based item. The electrical components may be mounted to a support structure such as a flexible printed circuit. The flexible printed circuit may have a mesh shape formed from an array of openings. Serpentine flexible printed circuit segments may extend between the openings. The electrical components may be light-emitting diodes or other electrical devices. Polymer with light-scattering particles or other materials may cover the electrical components. The flexible printed circuit may be laminated between fabric layers or other layers of material in the fabric-based item.

9 Claims, 12 Drawing Sheets

Related U.S. Application Data

(60) Provisional application No. 62/207,499, filed on Aug. 20, 2015.

(51) Int. Cl.
    *H05K 1/18*     (2006.01)
    *H05K 1/03*     (2006.01)
    *D02G 3/44*     (2006.01)
    *G01D 11/30*     (2006.01)
    *H01L 23/31*     (2006.01)
    *H01L 25/075*     (2006.01)
    *H01L 33/56*     (2010.01)
    *A41D 1/00*     (2018.01)
    *H05K 1/02*     (2006.01)
    *H05K 3/28*     (2006.01)
    *F21Y 115/10*     (2016.01)
    *H01L 21/48*     (2006.01)
    *H01L 23/00*     (2006.01)
    *H01L 33/62*     (2010.01)

(52) U.S. Cl.
CPC ...... *H01L 23/3121* (2013.01); *H01L 23/5386* (2013.01); *H01L 25/0753* (2013.01); *H01L 33/56* (2013.01); *H05K 1/038* (2013.01); *H05K 1/189* (2013.01); *A41D 1/005* (2013.01); *F21Y 2115/10* (2016.08); *H01L 21/4853* (2013.01); *H01L 24/16* (2013.01); *H01L 33/62* (2013.01); *H01L 2224/16225* (2013.01); *H01L 2224/16227* (2013.01); *H01L 2924/15174* (2013.01); *H01L 2933/0091* (2013.01); *H05K 1/0283* (2013.01); *H05K 3/284* (2013.01); *H05K 2201/10106* (2013.01); *H05K 2201/2009* (2013.01)

(56) References Cited

U.S. PATENT DOCUMENTS

| | | | |
|---|---|---|---|
| 8,127,440 | B2 | 3/2012 | Douglas |
| 10,553,540 | B2* | 2/2020 | Sunshine ............ H01L 23/5386 |
| 2006/0007059 | A1 | 1/2006 | Bell |
| 2006/0169989 | A1* | 8/2006 | Bhattacharya ........ H01L 21/469 |
| | | | 257/79 |
| 2007/0053179 | A1 | 3/2007 | Pang et al. |
| 2008/0196783 | A1* | 8/2008 | Van Bruggen ...... D03D 1/0088 |
| | | | 139/319 |
| 2008/0196940 | A1 | 8/2008 | Stobbe et al. |
| 2008/0218369 | A1* | 9/2008 | Krans ................. A47G 9/1045 |
| | | | 340/691.1 |
| 2009/0027603 | A1 | 1/2009 | Samulski et al. |
| 2010/0065873 | A1 | 3/2010 | Bhattacharya et al. |
| 2010/0208445 | A1 | 8/2010 | Asvadi et al. |
| 2012/0250329 | A1 | 10/2012 | Suehiro et al. |
| 2015/0181692 | A1 | 6/2015 | Jezewski et al. |
| 2016/0058375 | A1 | 3/2016 | Rothkopf |
| 2016/0320037 | A1 | 11/2016 | Wong et al. |
| 2017/0038047 | A1 | 2/2017 | Golle et al. |
| 2017/0198900 | A1 | 7/2017 | Speier |

FOREIGN PATENT DOCUMENTS

| | | |
|---|---|---|
| WO | 02/34019 A1 | 4/2002 |
| WO | 2004100111 A2 | 11/2004 |
| WO | 2006/129223 A1 | 12/2006 |
| WO | 2007/141726 A1 | 12/2007 |
| WO | 2008/007237 A2 | 1/2008 |
| WO | 2008/120134 A1 | 10/2008 |
| WO | 2010/032173 A1 | 3/2010 |
| WO | 2011/110974 A1 | 9/2011 |
| WO | 2015/103580 A2 | 7/2015 |

* cited by examiner

FABRIC-BASED ITEMS WITH ELECTRICAL COMPONENT ARRAYS

This application is a continuation of U.S. non-provisional patent application Ser. No. 15/752,480, filed Feb. 13, 2018, which is a 371 of PCT patent application No. PCT/US2016/047259, filed Aug. 17, 2016, which claims priority to U.S. provisional patent application No. 62/207,499, filed Aug. 20, 2015, which are all hereby incorporated by reference herein in their entireties.

BACKGROUND

This relates generally to fabric-based items and, more particularly, to fabric-based items with arrays of electrical components.

It may be desirable to form furniture, clothing, and other items from materials such as fabric. Fabric-based items generally do not include electrical components. It may be desirable, however, to incorporate electrical components into a fabric-based item to provide a user of a fabric-based item with enhanced functionality.

It can be challenging to incorporate electrical components into a fabric-based item. Fabric is flexible, so it can be difficult to mount structures to fabric. Electrical components must be coupled to signal paths, but unless care is taken, signal paths will be damaged as fabric is bent and stretched.

It would therefore be desirable to be able to provide improved techniques for incorporating electrical components into fabric-based items.

SUMMARY

A fabric-based item may include electrical components. A fabric-based item may, for example, have an array of electrical components and one or more layers of fabric. Fabric layers may serve as substrates for electrical components or may be coupled to support structures on which electrical components have been mounted.

The electrical components may be mounted to a support structure such as a flexible printed circuit. The flexible printed circuit may have a mesh pattern formed from an array of openings. Serpentine flexible printed circuit segments may extend between the openings and may interconnect portions of the flexible printed circuit to which the electrical components have been soldered.

The electrical components may be light-emitting diodes or other electrical devices. Polymer with light-scattering particles or other materials may cover the electrical components. The flexible printed circuit and array of components may be laminated between fabric layers or other layers of material.

DETAILED DESCRIPTION

Figure 1:
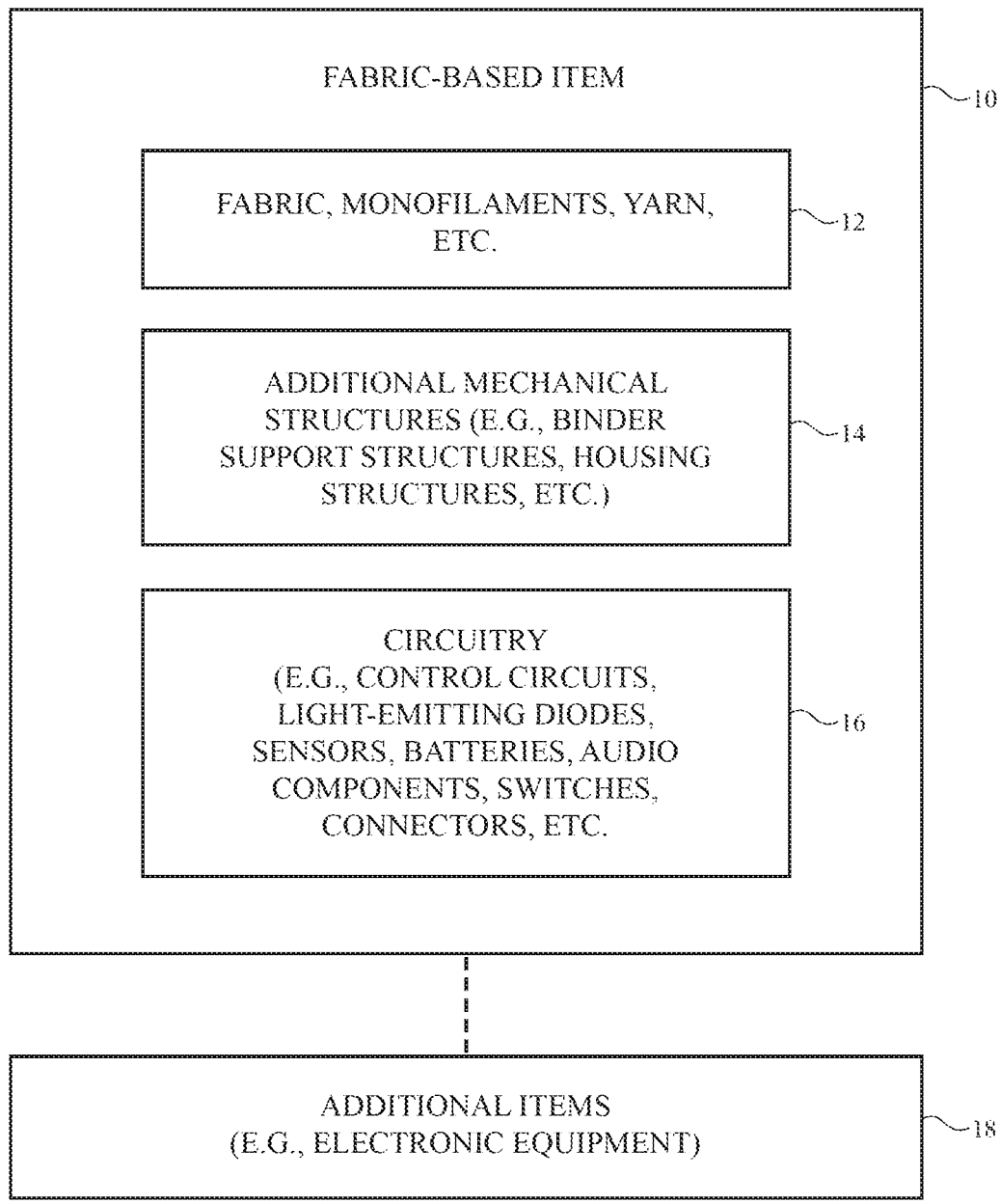
FIG. 1 is a schematic diagram of an illustrative fabric-based item in accordance with an embodiment.

Items such as item 10 of FIG. 1 may be based on fabric. Item 10 may be an electronic device or an accessory for an electronic device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which fabric-based item 10 is mounted in a kiosk, in an automobile, airplane, or other vehicle, other electronic equipment, or equipment that implements the functionality of two or more of these devices. If desired, item 10 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, etc.), or may be any other suitable fabric-based item.

Item 10 may include intertwined strands of material such as monofilaments and yarns that form fabric 12. Fabric 12 may form all or part of a housing wall or other layer in an electronic device, may form internal structures in an electronic device, or may form other fabric-based structures. Item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials.

The strands of material in fabric 12 may be single-filament strands (sometimes referred to as fibers) or may be yarns or other strands that have been formed by intertwining multiple filaments of material together. Examples of fabric 12 formed from yarn are sometimes described herein as an example. This is, however, merely illustrative. Yarn-based fabric for item 10 may, if desired, be partly or completely formed from monofilaments.

The yarns in fabric 12 may be formed from polymer, metal, glass, graphite, ceramic, natural materials as cotton or bamboo, or other organic and/or inorganic materials and combinations of these materials. Conductive coatings such as metal coatings may be formed on non-conductive material. For example, plastic yarns and monofilaments in fabric 12 may be coated with metal to make them conductive. Reflective coatings such as metal coatings may be applied to make yarns and monofilaments reflective. Yarns may be formed from a bundle of bare metal wires or metal wire intertwined with insulating monofilaments (as examples).

Yarn may be intertwined to form fabric 12 using intertwining equipment such as weaving equipment, knitting equipment, or braiding equipment. Intertwined yarn may, for example, form woven fabric. Conductive yarn and insulating yarn may be woven, knit, or otherwise intertwined to form contact pads that can be electrically coupled to conductive structures in item 10 such as the contact pads of an electrical component.

Conductive yarn and insulating yarn may also be woven, knit, or otherwise intertwined to form conductive paths. The conductive paths may be used in forming signal paths (e.g., signal buses, power lines, etc.), may be used in forming part of a capacitive touch sensor electrode, a resistive touch sensor electrode, or other input-output device, or may be used in forming other patterned conductive structures. Conductive structures in fabric 12 may be used in carrying power signals, digital signals, analog signals, sensor signals, control signals, data, input signals, output signals, or other suitable electrical signals.

Item 10 may include additional mechanical structures 14 such as polymer binder to hold yarns in fabric 12 together, support structures such as frame members, housing structures (e.g., an electronic device housing), and other mechanical structures.

To enhance mechanical robustness and electrical conductivity at yarn-to-yarn connections, additional structures and materials (e.g., solder, crimped metal connections, welds, conductive adhesive such as anisotropic conductive film and other conductive adhesive, non-conductive adhesive, fasteners, etc.) may be used to help form yarn-to-yarn connections. These yarn-to-yarn connections may be formed where yarns cross each other perpendicularly or at other yarn intersections where connections are desired. Insulating material can be interposed between intersecting conductive yarns at locations in which it is not desired to form a yarn-to-yarn connection. The insulating material may be plastic or other dielectric, may include an insulating yarn or a conductive yarn with an insulating coating or insulated conductive monofilaments, etc. Solder connections may be formed between conductive yarns by melting solder so that the solder flows over conductive yarns. The solder may be melted using an inductive soldering head to heat the solder, using a reflow oven to heat the solder, using a laser or hot bar to heat the solder, or using other soldering equipment. During soldering, outer dielectric coating layers (e.g., outer polymer layers) may be melted away in the presence of molten solder, thereby allowing underlying metal yarns to be soldered together.

Circuitry 16 may be included in item 10. Circuitry 16 may include electrical components that are coupled to fabric 12, electrical components that are housed within an enclosure formed by fabric 12, electrical components that are attached to fabric 12 using welds, solder joints, adhesive bonds (e.g., conductive adhesive bonds such as anisotropic conductive adhesive bonds or other conductive adhesive bonds), crimped connections, or other electrical and/or mechanical bonds. Circuitry 16 may include metal structures for carrying current, electrical components such as integrated circuits, light-emitting diodes, sensors, and other electrical devices. Control circuitry in circuitry 16 may be used to control the operation of item 10 and/or to support communications with item 18 and/or other devices.

Item 10 may interact with electronic equipment or other additional items 18. Items 18 may be attached to item 10 or item 10 and item 18 may be separate items that are configured to operate with each other (e.g., when one item is a case and the other is a device that fits within the case, etc.). Circuitry 16 may include antennas and other structures for supporting wireless communications with item 18. Item 18 may also interact with item 10 using a wired communications link or other connection that allows information to be exchanged.

In some situations, item 18 may be an electronic device such as a cellular telephone, computer, or other portable electronic device and item 10 may form a cover, case, bag, or other structure that receives the electronic device in a pocket, an interior cavity, or other portion of item 10. In other situations, item 18 may be a wrist-watch device or other electronic device and item 10 may be a strap or other fabric-based item that is attached to item 18 (e.g., item 10 and item 18 may together form a fabric-based item such as a wristwatch with a strap). In still other situations, item 10 may be an electronic device, fabric 12 may be used in forming the electronic device, and additional items 18 may include accessories or other devices that interact with item 10. Signal paths formed from conductive yarns and monofilaments may be used to route signals in item 10 and/or item(s) 18.

The fabric that makes up item 10 may be formed from yarns and/or monofilaments that are intertwined using any suitable intertwining equipment. With one suitable arrangement, which may sometimes be described herein as an example, fabric 12 may be woven fabric formed using a weaving machine. In this type of illustrative configuration, fabric may have a plain weave, a basket weave, a satin weave, a twill weave, or variations of these weaves, may be a three-dimensional woven fabric, or may be other suitable fabric.

Figure 2:
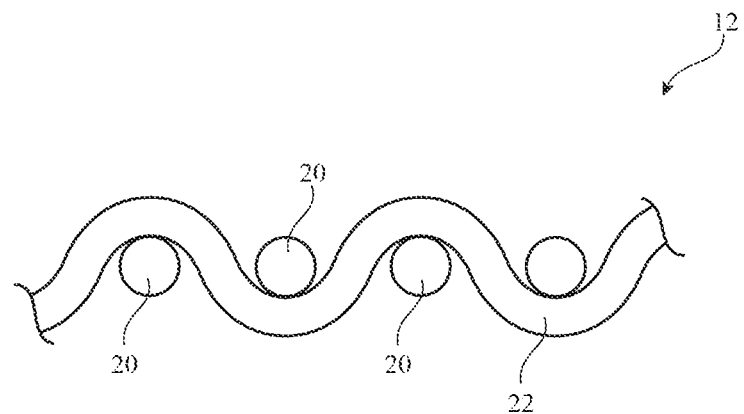
FIG. 2 is a side view of illustrative fabric in accordance with an embodiment.

A cross-sectional side view of illustrative woven fabric 12 is shown in FIG. 2. As shown in FIG. 2, fabric 12 may include yarns or other strands of material such as warp yarns 20 and weft yarns 22. In the illustrative configuration of FIG. 2, fabric 12 has a single layer of woven yarns. Multi-layer fabric constructions may be used for fabric 12 if desired.

Figure 3:
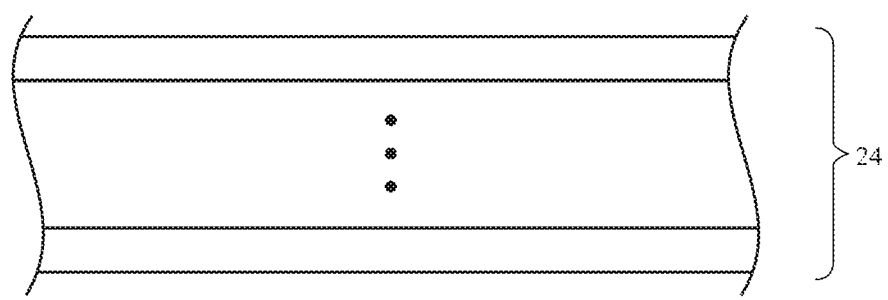
FIG. 3 is a side view of layers of material that may be incorporated into a fabric-based item in accordance with an embodiment.

Fabric-based item 10 may include non-fabric materials (e.g., structures formed from plastic, metal, glass, ceramic, crystalline materials such as sapphire, etc.). These materials may be formed using molding operations, machining, laser processing, and other fabrication techniques. In some configurations, some or all of fabric-based item 10 may include one or more layers of material such as layers 24 of FIG. 3. Layers 24 may include layers of polymer, metal, glass, fabric, adhesive, crystalline materials, ceramic, substrates on which components have been mounted, patterned layers of material, layers of material containing patterned metal traces, thin-film devices such as transistors, and/or other layers.

Figure 4:
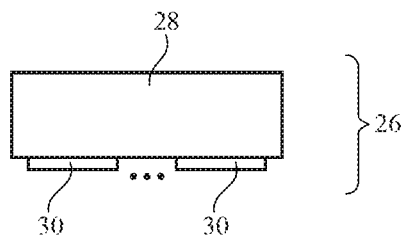
FIG. 4 is a cross-sectional side view of an illustrative electrical component in accordance with an embodiment.

A side view of an illustrative electrical component of the type that may be used in fabric-based item 10 is shown in FIG. 4. Electrical components in item 10 such as illustrative electrical component 26 of FIG. 4 may include discrete electrical components such as resistors, capacitors, and inductors, may include connectors, may include input-output devices such as switches, buttons, light-emitting components such as light-emitting diodes, audio components such as microphones and speakers, vibrators (e.g., piezoelectric actuators that can vibrate), solenoids, electromechanical actuators, motors, and other electromechanical devices, microelectromechanical systems (MEMs) devices, pressure sensors, light detectors, proximity sensors (light-based proximity sensors, capacitive proximity sensors, etc.), force sensors (e.g., piezoelectric force sensors), strain gauges, moisture sensors, temperature sensors, accelerometers, gyroscopes, compasses, magnetic sensors (e.g., Hall effect sensors and magnetoresistance sensors such as giant magnetoresistance sensors), touch sensors, and other sensors, components that form displays, touch sensors arrays (e.g., arrays of capacitive touch sensor electrodes to form a touch sensor that detects touch events in two dimensions), and other input-output devices, electrical components that form control circuitry such as non-volatile and volatile memory, microprocessors, application-specific integrated circuits, system-on-chip devices, baseband processors, wired and wireless communications circuitry, and other integrated circuits. Electrical components such as component 26 may be bare semiconductor dies (e.g., laser dies, light-emitting diode dies, integrated circuits, etc.) or packaged components (e.g. semiconductor dies or other devices packaged within plastic packages, ceramic packages, or other packaging structures). One or more electrical terminals such as contact pads 30 may be formed on body 28 of component 26. Body 28 may be a semiconductor die (e.g., a laser die, light-emitting diode die, integrated circuit, etc.) or may be a package for a component (e.g., a plastic package or other dielectric package that contains one or more semiconductor dies or other electrical devices). Contacts for body 28 such as pads 30 may be protruding leads, may be planar contacts, may be formed in an array, may be formed on any suitable surfaces of body 28, or may be any other suitable contacts for forming electrical connections to component 26. For example, pads 30 may be metal solder pads.

Figure 5:
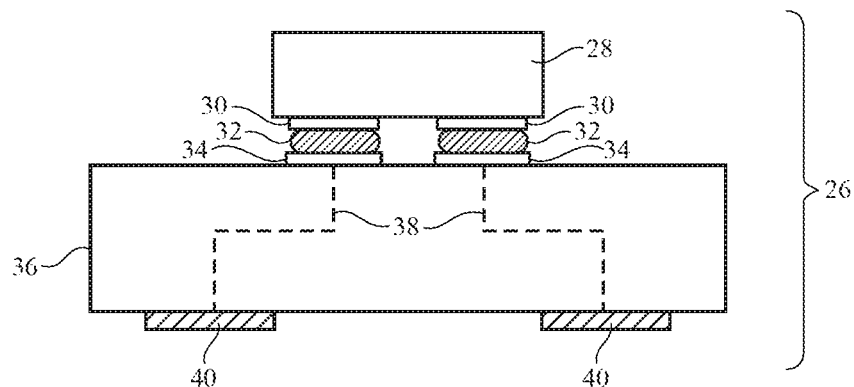
FIG. 5 is a cross-sectional side view of an illustrative electrical component having an electrical device mounted on an interposer in accordance with an embodiment.

As shown in the example of FIG. 5, body 28 may be mounted on a support structure such as interposer 36. Interposer 36 may be a printed circuit, ceramic carrier, or other dielectric substrate. Interposer 36 may be larger than body 28 or may have other suitable sizes. Interposer 36 may have a planar shape with a thickness of 700 microns, more than 500 microns, less than 500 microns, or other suitable thickness. The thickness of body 28 may be 500 microns, more than 300 microns, less than 1000 microns, or other suitable thickness. The footprint (area viewed from above) of body 28 and interposer 36 may be 10 microns×10 microns, 100 microns×100 microns, more than 1 mm×1 mm, less than 10 mm×10 mm, may be rectangular, may be square, may have L-shapes, or may have other suitable shapes and sizes.

Interposer 36 may contain signal paths such as metal traces 38. Metal traces 38 may have portions forming contacts such as pads 34 and 40. Pads 34 and 40 may be formed on the upper surface of interposer 36, on the lower surface of interposer 36, or on the sides of interposer 36. Conductive material such as conductive material 32 may be used in mounting body 28 to interposer 36. Conductive material 32 may be solder (e.g., low temperature or high temperature solder), may be conductive adhesive (isotropic conductive adhesive or anisotropic conductive film), may be formed during welding, or may be other conductive material for coupling electrical device pads (body pads) such as pads 30 on body 28 to interposer pads 34. Metal traces 38 in interposer 36 may couple pads 34 to other pads such as pads 40. If desired, pads 40 may be larger and/or more widely spaced than pads 34, thereby facilitating attachment of interposer 36 to conductive yarns and/or other conductive paths in item 10. Solder, conductive adhesive, or other conductive connections may be used in coupling pads 40 to conductive yarn, conductive monofilament, printed circuit traces, or other conductive path materials in fabric-based item 10.

Figure 6:
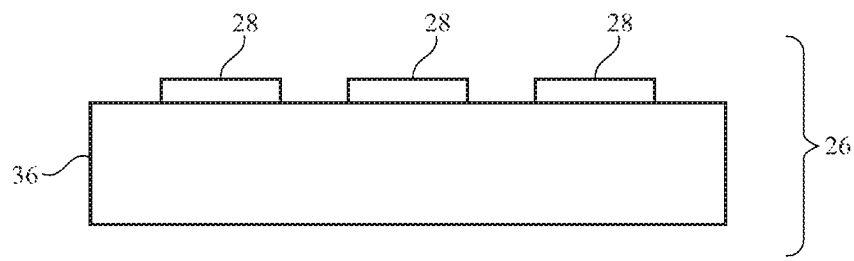
FIG. 6 is a cross-sectional side view of an illustrative electrical component having multiple electrical devices mounted on an interposer in accordance with an embodiment.

FIG. 6 shows how interposer 36 may be sufficiently large to accommodate multiple electrical devices each with a respective body 28. For example, multiple light-emitting diodes, sensors, and/or other electrical devices may be mounted to a common interposer such as interposer 36 of FIG. 6. The light-emitting diodes may be micro-light-emitting diodes (e.g., light-emitting diode semiconductor dies having footprints of about 10 microns×10 microns, more than 5 microns×5 microns, less than 100 microns×100 microns, or other suitable sizes). The light-emitting diodes may include light-emitting diodes of different colors (e.g., red, green, blue, white, etc.). Redundant light-emitting diodes or other redundant circuitry may be included on interposer 36. In configurations of the type shown in FIG. 6 in which multiple electrical devices (each with a respective body 28) are mounted on a common interposer, electrical component 26 may include any suitable combination of electrical devices (e.g., light-emitting diodes, sensors, integrated circuits, actuators, and/or other devices of the type described in connection with electrical component 26 of FIG. 4).

Figure 7:
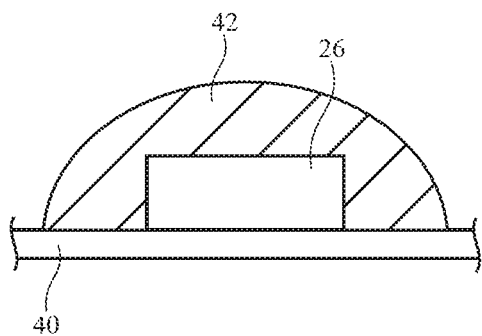
FIG. 7 is a cross-sectional side view of an illustrative electrical component mounted on a substrate and covered with a bead of polymer in accordance with an embodiment.

Electrical components may be coupled to fabric structures, individual yarns or monofilaments, printed circuits (e.g., rigid printed circuits formed from fiberglass-filled epoxy or other rigid printed circuit board material or flexible printed circuits formed from polyimide substrate layers or other sheets of flexible polymer materials), metal or plastic parts with signal traces, or other structures in item 10. In the configuration of FIG. 7, component 26 has been mounted to support structure 40 (e.g., a layer of fabric, a printed circuit, etc.).

It may be desired to cover component 26 with one or more layers of material. For example, in configurations in which component 26 is sensitive to moisture, it may be desirable to seal component 26 within a waterproof material. In configurations in which component 26 emits light, it may be desirable to cover component 26 with a light-diffusing layer such as a polymer layer including metal oxide particles (e.g., white particles of titanium dioxide, colored particles, or other light-diffusing particles). Opaque materials and/or materials with other optical, mechanical, and/or electrical properties may also be used to cover some or all of component 26. In the illustrative configuration of FIG. 7, a bead of polymer such as polymer 42 has been used to cover component 26 and an adjacent portion of the upper surface of support structure 40. Polymer 42 may be, for example, a light-diffusing material such as a white potting compound (e.g., a polymer with white light scattering particles). Other materials may be used to cover electrical components on support structure 40 if desired. The configuration of FIG. 7 in which a bead of light-diffusing polymer has been used to cover electrical component 26 is merely illustrative.

Figure 8:
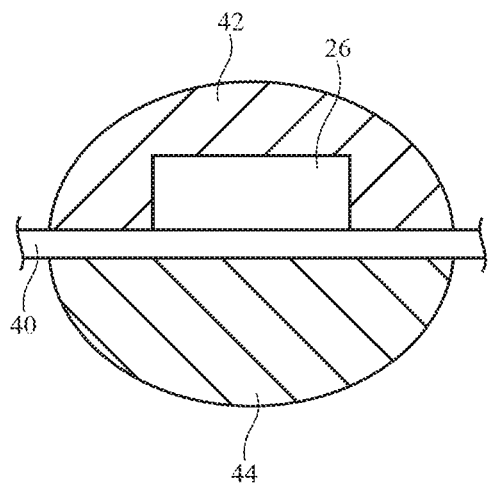
FIG. 8 is a cross-sectional side view of an illustrative electrical component that is covered with a bead of polymer such as a translucent polymer and that overlaps a bead of polymer such as an opaque polymer bead in accordance with an embodiment.

FIG. 8 shows how beads of polymer or other materials may be formed above and below component 26. Upper bead 42 may cover component 26 and adjacent portions of support structure 40. Lower bead 44 may cover the rear of support structure 40 under component 26. With one illustrative arrangement, support structure 40 of FIG. 8 is a flexible substrate layer (e.g., a flexible printed circuit layer), upper bead 42 is a light-diffusing bead of polymer, and lower bead 44 is an opaque (e.g., black) bead of light-absorbing polymer. Bead 42 may help diffuse and homogenize light emitted by component 26 in the upwards direction and bead 44 may help to block stray light that might otherwise propagate in the downwards direction (in the orientation of FIG. 8).

The surface of support structure 40 to which bead 42 is attached may sometimes be referred to as a top surface, front surface, or outer surface of structure 40 and the surface of structure 40 to which bead 44 is attached may sometimes be referred to as a bottom surface, rear surface, or inner surface of structure 40. Arrangements in which an opaque bead of polymer is formed on an outer surface of structure 40 and a translucent bead of polymer is formed on the inner surface (backside) of structure 40 may be used, if desired. The configuration of FIG. 8 is presented as an example. If desired, beads of polymer or other material may be used to encapsulate component 26 and thereby protect component 26 from moisture, dust, and other contaminants, to help adhere component 26 to support structure 40, etc.

Figure 9:
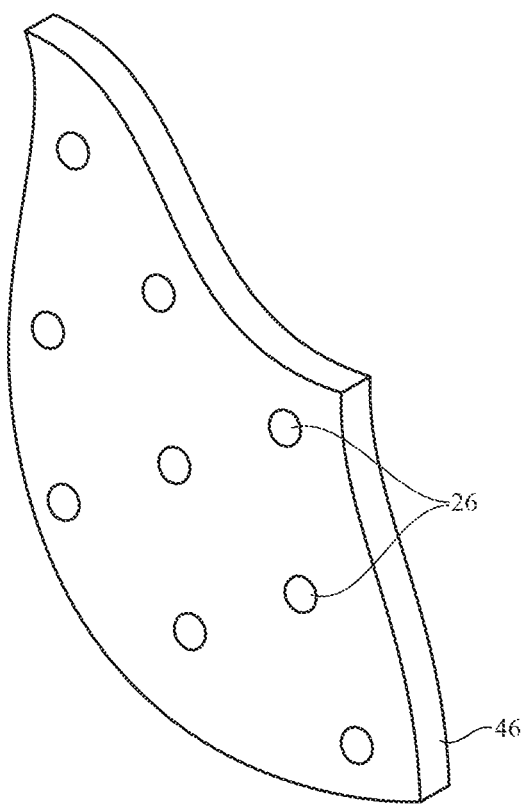
FIG. 9 is a perspective view of a layer of material in a fabric-based item that includes an array of electrical components in accordance with an embodiment.

One or more electrical components 26 may be included in item 10. In some configurations, housing walls, interior housing structures, planar layers of material, and/or other layers of material may be provided with multiple components 26. As shown in FIG. 9, for example, structure 46 may be provided with an array of electrical components 26. Structure 46 may include a support structure such as support structure 40 of FIGS. 7 and 8 (or may be a structure such as support structure 40). Components 26 may be arranged in a two-dimensional array (e.g., an array having rows and columns), may be arranged in a pseudo-random pattern, may be arranged in circles, lines, or triangles, or other shapes, or may be organized in other patterns. Structure 46 may be flexible and stretchable and may include outer layers of fabric or other materials. Structure 46 may be used in forming a wall for a bag, a portion of a strap, a layer in a piece of clothing or other item, or other portion of fabric-based item 10.

Components 26 may be mounted on the outermost surface of structure 46, or may be mounted in an interior portion of structure 46. For example, structure 46 may include multiple layers of material (plastic layers, printed circuit layers, adhesive layers, fabric layers, etc.). In this type of arrangement, structure 46 may include window structures in alignment with components 26. For example, structure 46 may include an array of light-transparent windows in a configuration in which components 26 are light-emitting diodes or other light sources and/or are light detectors. As another example, components 26 may be antennas or other components that use radio-frequency electromagnetic signals. In this type of arrangement, structure 46 may include radio-transparent windows (e.g. windows formed from plastic or other dielectric that allows radio-frequency signals to pass). In configurations in which electrical components 26 are temperature sensors, the windows in structure 46 may be thermally conductive windows that allow temperature measurements to be made by components 26. Windows may be circular, square, may form part of elongated shapes (e.g., strips of window material), may have shapes with combinations of curved and straight sides, and/or may have other suitable shapes. Configurations for structure 46 in which structure 46 has a uniform appearance (with no discernable windows) may also be used (e.g., by providing all of a fabric layer or other outer layer in structure 46 with appropriate light-transmission properties, radio-transparency properties, and/or thermal conductivity properties or other properties that are compatible with components 26).

Figure 10:
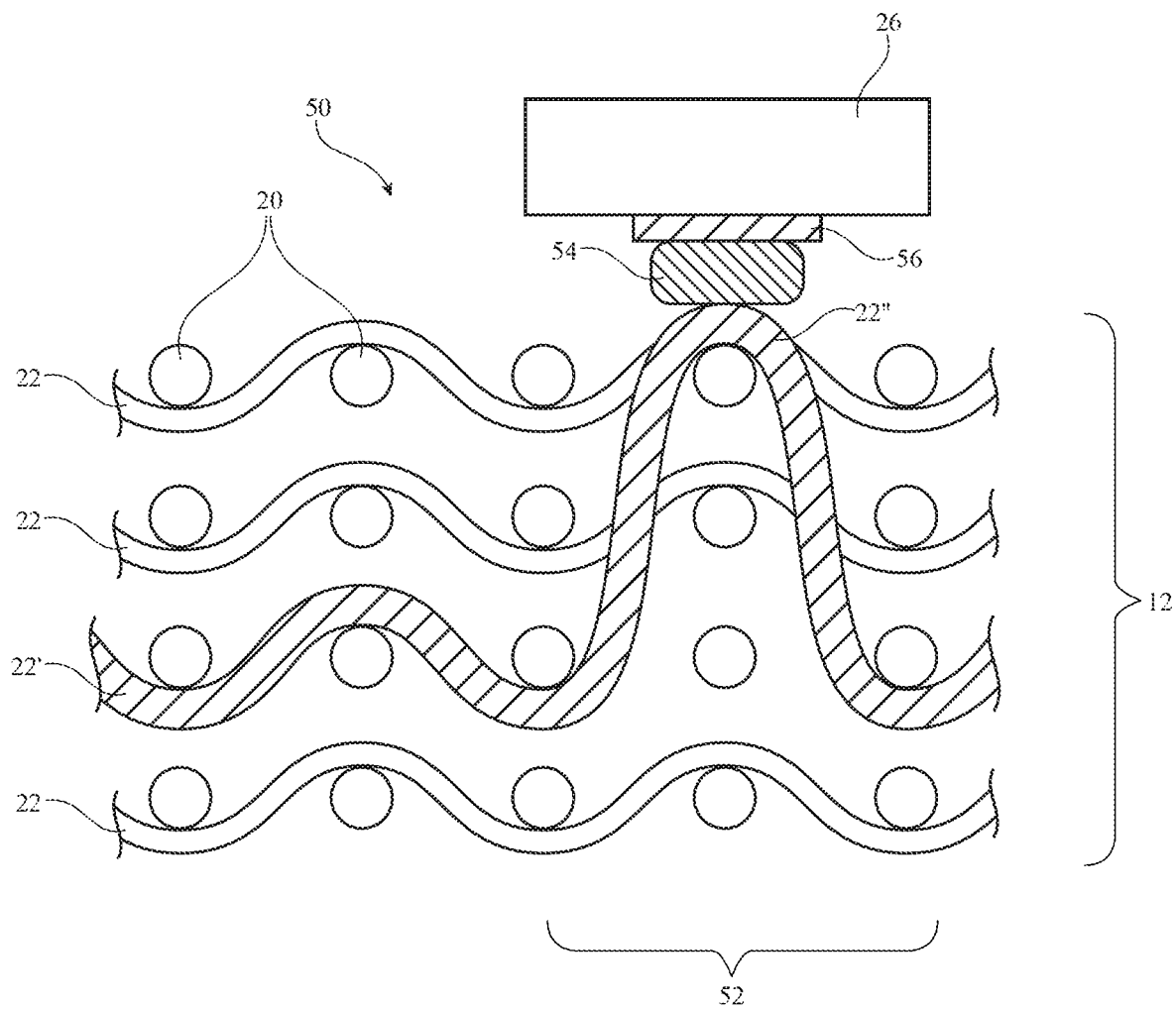
FIG. 10 is a cross-sectional side view of an illustrative fabric layer showing how a conductive strand of material such as a conductive yarn may be selectively brought to the surface of the fabric layer and used to form a contact such as a solder pad for coupling to an electrical component in accordance with an embodiment.
Figure 11:
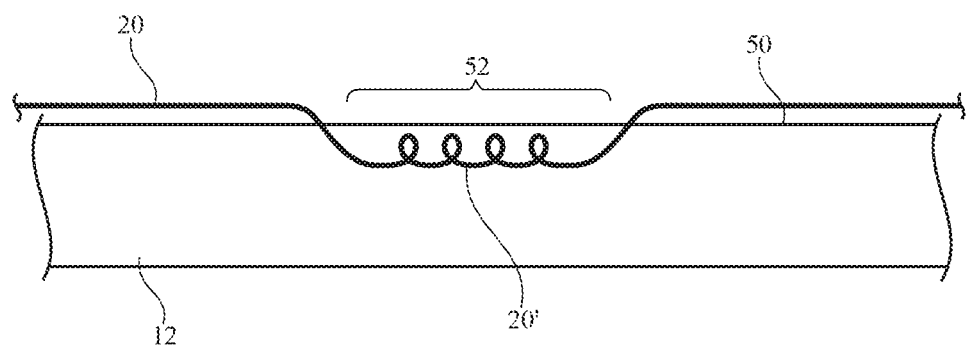
FIG. 11 is a cross-sectional side view of an illustrative layer of fabric having an area into which extra strands of material such as floating conductive warp yarns are being incorporated to form a contact such as a solder pad in accordance with an embodiment.

In some configurations, item 10 may include electrical connections between components 26 and conductive paths in fabric 12. Fabric 12 may include conductive yarns and/or conductive monofilaments for carrying signals. The yarns and/or monofilaments may be used to form fabric contact pads. Consider, as an example, fabric 12 of FIG. 10. As shown in FIG. 10, fabric 12 may contain strands of material such as warp yarns 20 and weft yarns 22. One or more of these yarns may be conductive and may be exposed on the surface of fabric 12 to form a contact pad. In the example of FIG. 10, conductive yarn 22' has been woven in a pattern that causes portion 22" of yarn 22' to form a contact pad on upper surface 50 of fabric layer 12 in region 52. Component 26 may have contact pads such as pad 56. Solder or other conductive material 54 may be used to couple pad 56 to the pad formed by portion 22" of yarn 22'. In the illustrative configuration of FIG. 10, pad 22' has been formed by selectively raising weft yarn 22' to surface 50 in region 52 (e.g., using a three-dimensional weaving machine). If desired, warp yarns or other suitable strands of material in fabric 12 may be used to form contact pad 22'. As shown in FIG. 11, for example, portion 20' of floating warp yarn 20 may be used in forming a contact pad on surface 50 of fabric 12 (and remaining portions of yarn 20 may be trimmed away). Embossing techniques (e.g., techniques for incorporating conductive yarns into fabric 12 using sewing equipment) may also be used to form fabric contact pads in fabric 12. If desired, transparent yarns or yarns having other desired properties may likewise be patterned to form surface structures such as pad 22' of FIG. 11 (e.g., to from transparent windows for underlying components 26). The use of weaving techniques and other patterning techniques to form solder pads is merely illustrative.

Figure 12:
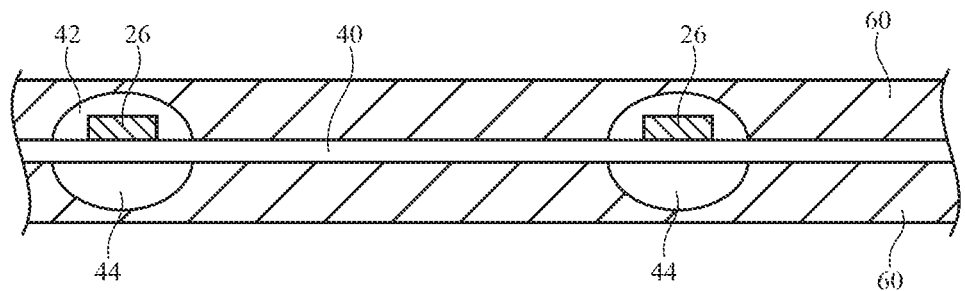
FIG. 12 is a cross-sectional side view of an array of electrical components covered with beads of polymer and embedded within polymer or other materials in accordance with an embodiment.
Figure 13:
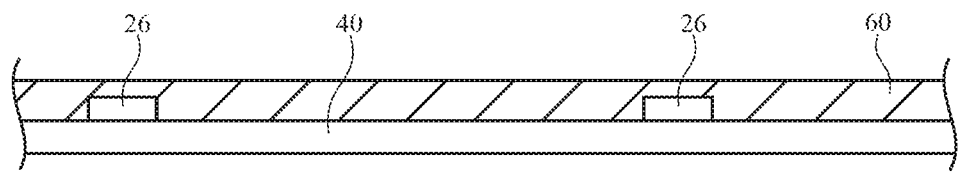
FIG. 13 is a cross-sectional side view of an illustrative substrate layer populated with an array of electrical components and covered with a layer of material such as a polymer layer in accordance with an embodiment.
Figure 14:
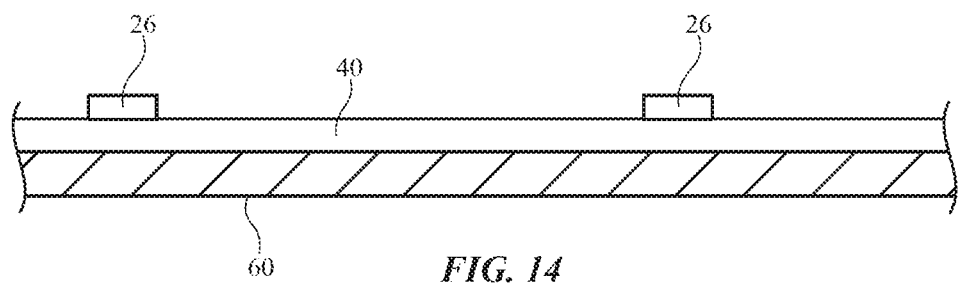
FIG. 14 is a cross-sectional side view of an illustrative substrate layer populated with an array of electrical components and having a lower surface covered with a layer of material such as a polymer layer in accordance with an embodiment.

As shown in FIG. 12, components 26 on support structure 40 may, if desired, be embedded within layers of material such as layer 60. Layer 60 may be an elastomeric material such as a stretchy polymer (e.g., silicone, polyurethane, acrylic, or other low modulus polymer that can stretch without failing). If desired, beads of polymer or other material such as beads 42 and/or 44 may be formed over and/or under components 26 (e.g., to help encapsulate components 26, to adjust the optical characteristics of the materials near components 26, etc.). Layer 60 may cover beads 42 and/or beads 44. Layer 40 may be formed from fabric (e.g., fabric with contact pads formed using conductive yarns as shown in FIGS. 10 and 11), may be a flexible printed circuit layer, or may be other suitable support layer. Layer 60 may be formed on the upper and lower surfaces of support structure 40 (e.g., in an arrangement that covers beads 42 and/or 44), may be formed only on the upper surface of structure 40 (as shown in FIG. 13), or may be formed only on the lower surface of structure 40 (as shown in FIG. 14).

An array of components 26 may be mounted to a layer of fabric or other material that is flexible and/or stretchable (see, e.g., structure 46 of FIG. 9). As described in connection with FIG. 9, windows may be provided in the material to which components 26 are mounted in alignment with components 26 (if desired) or windows may be omitted from structure 46 (e.g., in configurations where structure 46 has suitable properties such as desired levels of light transmission, etc.).

Figure 15:
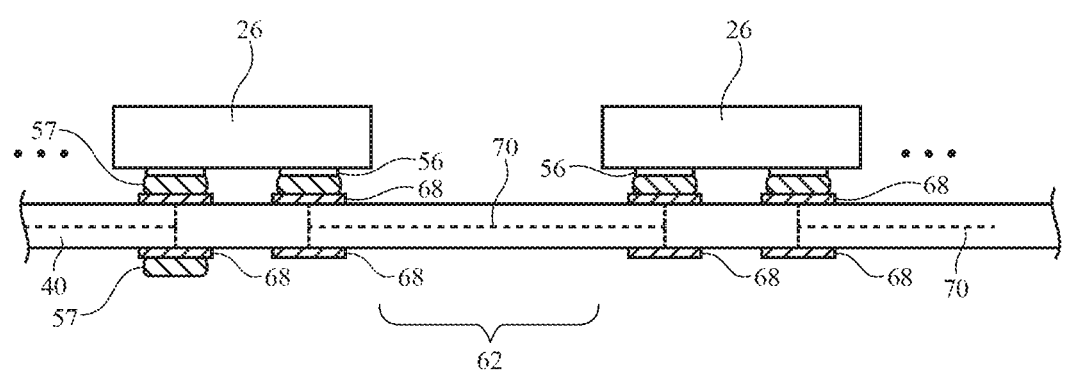
FIG. 15 is a cross-sectional side view of an illustrative array of electrical components mounted on a substrate such as a flexible polymer substrate of the type that may be provided with an optional array of openings to enhance flexibility in accordance with an embodiment.

To accommodate configurations in which components 26 are mounted within layers of flexible and/or stretchable material, it may be desirable to form support structure 40 using a flexible and/or stretchable structure. If desired, the flexibility and/or stretchability of support structure 40 may be enhanced by forming openings in structure 40. As shown in FIG. 15, openings that pass completely or partly through support structure 40 may be formed in regions of support structure 40 such as region 62 that are located between electrical components 26. With one illustrative configuration, support structure 40 is a flexible printed circuit (e.g., a layer of polyimide or a sheet of other flexible printed circuit polymer) and openings 62 are organized in an array to provide the printed circuit layer with a mesh shape having enhanced flexibility and stretchability.

FIG. 15 also shows how support structure 40 may include metal traces 70. Metal traces 70 may be used to interconnect components 26 and to route signals between components 26 and other circuitry in item 10. Portions of metal traces 70 may be used to form contact pads such as pads 68 on the upper and/or lower surfaces of structure 40. Solder 57 may be used to couple pads 68 to mating pads on other structures in item 10 (e.g., fabric contact pads, printed circuit contact pads, component contact pads such as pads 56, etc.).

Figure 16:
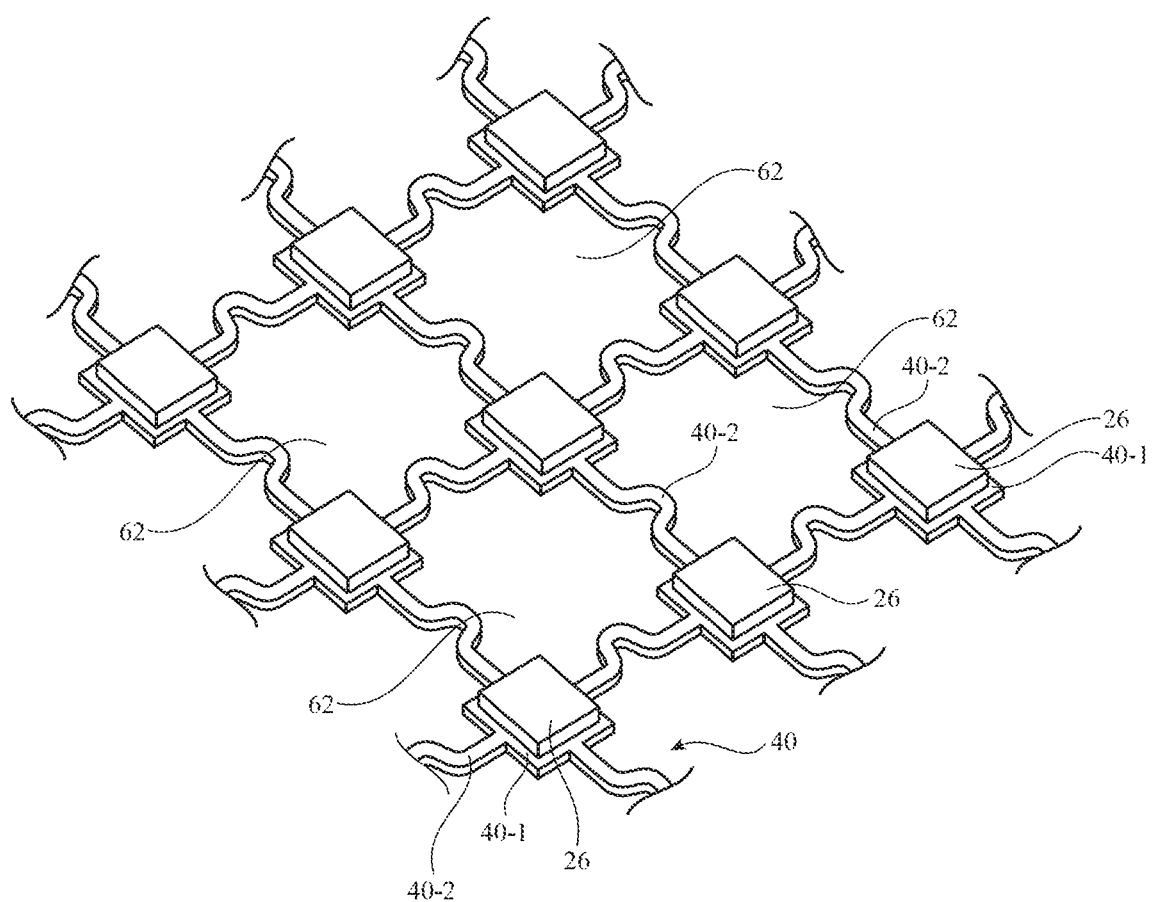
FIG. 16 is a perspective view of an illustrative mesh-shaped (mesh-patterned) flexible substrate populated with an array of electrical components in accordance with an embodiment.

A perspective view of support structure 40 (e.g., a printed circuit substrate or other substrate layer) having a mesh shape formed from an array of openings 62 is shown in FIG. 16. As shown in FIG. 16, the array of openings 62 may have regions 40-1 (sometimes referred to as islands, island regions, or component support regions) to which components 26 are mounted (see, e.g., components 26 of FIGS. 4, 5, and 6). Regions 40-1 may be interconnected by elongated portions of support structure 40 such as segments 40-2. Segments 40-2 may extend between openings 62 and may be straight, may be curved, or may have both straight and curved portions. In the illustrative configuration of FIG. 16, segments 40-2 have serpentine shapes to help enhance the flexibility and stretchability of structure 40 without damaging structure 40 or components 26. Other mesh-shaped support structures may be used, if desired (e.g., mesh substrates with circular openings, triangular openings, mesh patterns with a combination of circular and square openings, meshes with non-regular patterns of openings, etc.).

Figure 17:
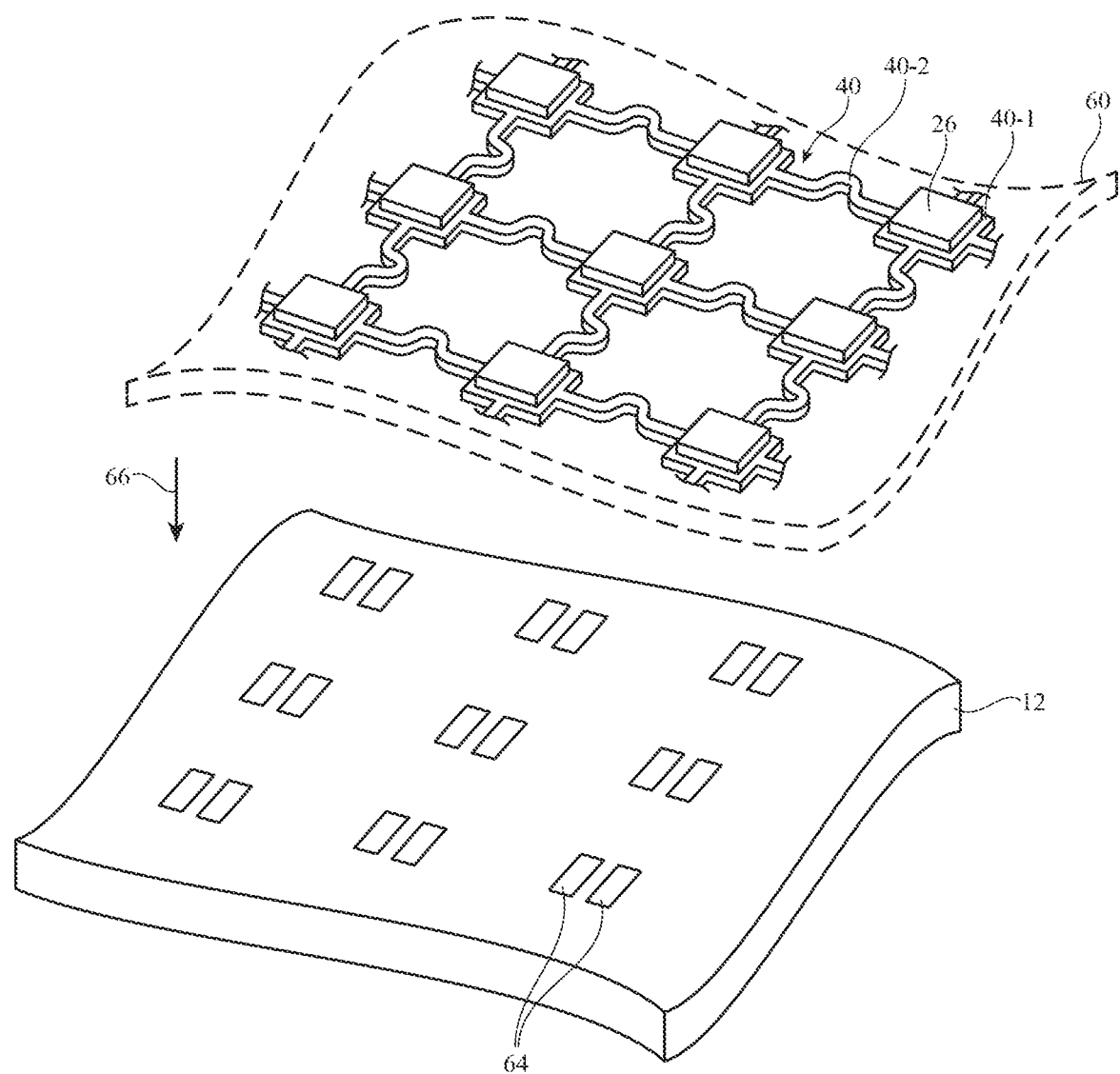
FIG. 17 is an exploded perspective view of an illustrative mesh-shaped (mesh-patterned) flexible substrate and associated layer of material such as a fabric layer or other flexible layer with mating contact pads in accordance with an embodiment.

As shown in FIG. 17, a mesh-shaped flexible printed circuit or other support structure 40 that is populated with an array of components 26 may be coupled to fabric layer 12. Fabric layer 12 may contain an array of pads such as pads 64. Pads 64 may be formed using conductive yarns (e.g., conductive warp or weft yarns) or may be formed from other conductive pad structures. Pads 64 may be patterned in an array that matches a corresponding array of printed circuit pads on the lower surface of structure 40 such as pads 68 of FIG. 15. Solder may be used to join the pads of structure 40 and pads 64 when structure 40 is moved in direction 66 of FIG. 17. As shown by optional layer 60, structure 40, components 26, and/or layer 12 may be embedded within a layer of polymer or other flexible and stretchable material. Layer 60 may be clear, translucent, opaque, may have white light-scattering particles, may have colored light-scattering particles, or may have other suitable optical, electrical, and mechanical properties.

As described in connection with FIG. 9, components 26 may be mounted in a structure such as structure 46 (e.g., a wall or other layer of material in item 10, part of a band or strap, etc.). Structure 46 may be, for example, a flexible and stretchable layer that is used in forming the outermost layer(s) of material in item 10 or other flexible and stretchable portions of item 10. A mesh-shaped (mesh-patterned) flexible printed circuit substrate or other support layer 40 may be laminated to layers of fabric, plastic, metal, and/or other materials to form a multilayer flexible and stretchable structure such as structure 46.

Figure 18:
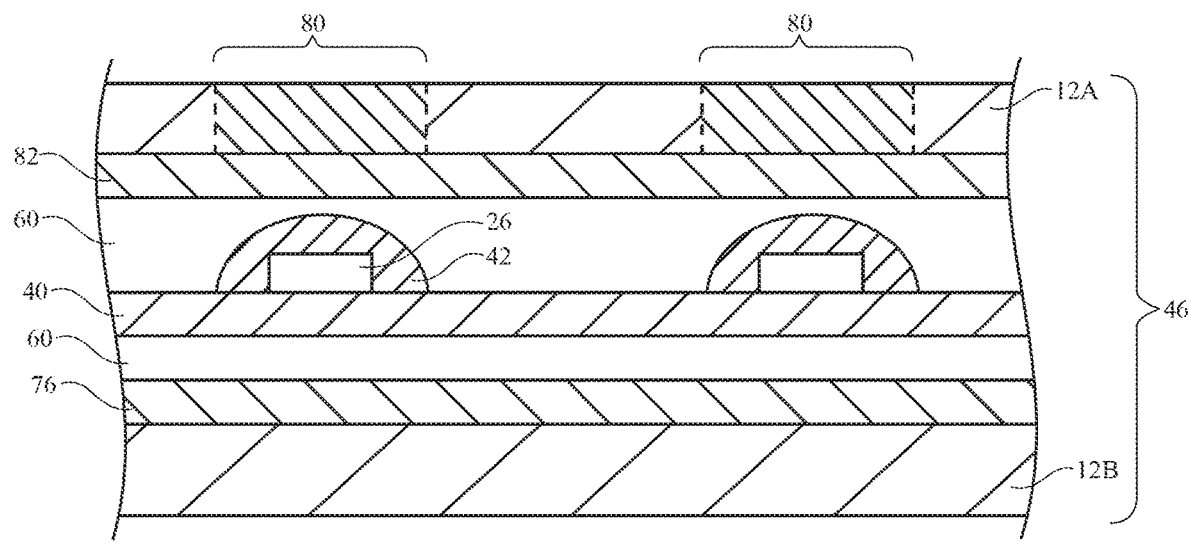
FIG. 18 is a cross-sectional side view of an illustrative array of components mounted on a flexible substrate and laminated between layers of fabric in accordance with an embodiment.

A cross-sectional side view of a flexible and stretchable structure of this type is shown in FIG. 18. As shown in FIG. 18, flexible and stretchable layer 46 may include structure 40. Structure 40 may be a mesh-shaped flexible printed circuit (e.g., a mesh formed from a patterned layer of polyimide or other polymer with an array of openings 62, islands 40-1 with pads to which pads on components 26 are soldered or otherwise coupled using conductive material, and elongated portions such as serpentine segments 40-2 that couple respective islands 40-1). Components 26 may be mounted on structure 40 using solder, anisotropic conductive adhesive, isotropic conductive adhesive, or other conductive material. Optional beads of polymer may be provided on structure 40, such as beads 42 over components 26. Beads 42 may contain light scattering particles (e.g., beads 42 may be translucent light-scattering material such as a polymer containing titanium diode particles or other light-scattering particles that scatter light emitted by component 26).

An elastomeric layer such as optional elastomeric polymer layer 60 may be formed over and under structure 40 (i.e., structure 40 may be embedded within layer 60). Layer 60 may be a clear stretchable polymer or other suitable material. Fabric layers or other layers of material may be attached to structure 40. In the example of FIG. 18, structure 46 has an outer surface formed by outer fabric layer 12A and has an inner surface formed by inner fabric layer 12B. Layer 12A may have windows 80. Windows 80 may be formed from regions of lowered yarn density, regions of enhanced yarn transparency, regions with different types of yarn, regions in which perforations or other openings have been formed in fabric 12A, regions into which clear polymer or other polymer has been embedded into fabric 12A (e.g., regions with an embedded polymer that differs from a polymer embedded in adjacent portions of fabric 12A), or other window structures. If desired, windows 80 may be omitted (e.g., in configurations in which fabric 12A is sufficiently transparent to allow light from components 26 to pass or has other desired properties). Adhesive layer 82 may be used to attach fabric 12A to layer 60 (and thereby mount fabric 12A to structure 40). Adhesive layer 76 may be used to attach fabric 12B (or other layer of material such as a polymer sheet, etc.) to layer 60 (and thereby mount fabric 12B to structure 40).

Adhesive layers such as layers 82 and 76 may be pressure sensitive adhesive layers, liquid adhesive, or other suitable adhesive. If desired, polymer layer 60 may be omitted from one or both sides of structure 40, polymer beads 42 may be omitted, additional polymer beads 44 may be included, and/or one or more intervening layers of material and adhesive layers may be interposed between the layers of FIG. 18 and/or otherwise attached to structure 46. The configuration of FIG. 18 is merely illustrative.

In accordance with an embodiment, a fabric-based item is provided that includes an array of electrical components mounted on a flexible substrate, a polymer layer in which the array of electrical components and flexible substrate are embedded, and a fabric layer to which the polymer layer is attached.

In accordance with another embodiment, the flexible substrate includes a flexible printed circuit having an array of openings.

In accordance with another embodiment, the electrical components include light-emitting diodes and the polymer layer includes a clear polymer layer.

In accordance with another embodiment, the fabric-based item includes a bead of translucent polymer covering each of the electrical components.

In accordance with another embodiment, the beads of translucent polymer are embedded within the clear polymer layer.

In accordance with another embodiment, the fabric-based item includes opaque beads of polymer each of which is overlapped by a respective one of electrical components.

In accordance with another embodiment, the fabric-based item includes a layer of adhesive interposed between the fabric layer and the polymer layer.

In accordance with another embodiment, the flexible substrate includes a substrate layer with an array of openings and metal traces that form solder pads and the electrical components have solder pads that are soldered to the solder pads on the substrate layer.

In accordance with another embodiment, each of the electrical components includes an interposer to which multiple semiconductor dies are mounted.

In accordance with another embodiment, the flexible substrate layer includes a fabric substrate.

In accordance with another embodiment, the fabric substrate has contact pads to which the electrical components are electrically coupled.

In accordance with another embodiment, the contact pads of the fabric substrate are formed from conductive yarn in the fabric substrate and the fabric-based item includes solder with which the contact pads of the fabric substrate are soldered to solder pads in the electrical component.

In accordance with another embodiment, apparatus is provided that includes an array of electrical components mounted on a substrate that has an array of openings, and a fabric layer attached to the substrate.

In accordance with another embodiment, the substrate includes a flexible printed circuit having portions to which the electrical components are soldered and having serpentine segments extending between the portions to which the electrical components are soldered.

In accordance with another embodiment, the electrical components include light-emitting diodes.

In accordance with another embodiment, the apparatus includes translucent polymer covering the light-emitting diodes.

In accordance with another embodiment, the apparatus includes a layer of adhesive interposed between the fabric layer and the substrate with the array of openings.

In accordance with another embodiment, the electrical components include actuators.

In accordance with another embodiment, the electrical components include sensors.

In accordance with an embodiment, a fabric-based item is provided that includes a fabric layer, a layer of material, electrical components, and a flexible printed circuit to which the electrical components are mounted, the flexible printed circuit has a plurality of openings and is mounted between the fabric layer and the layer of material.

In accordance with another embodiment, the layer of material includes fabric.

In accordance with another embodiment, the electrical components are soldered to the flexible printed circuit, the fabric-based item includes a first layer of adhesive between the fabric layer and the flexible printed circuit, and a second layer of adhesive between the layer of material and the flexible printed circuit.

In accordance with another embodiment, the fabric-based item includes polymer that contains light-scattering particles and that overlaps the electrical components.

In accordance with another embodiment, the electrical components include actuators and sensors.

In accordance with an embodiment, a fabric-based item is provided that includes a first fabric layer, a second fabric layer, electrical components, a flexible printed circuit to which the electrical components are attached, the flexible printed circuit has an array of openings and is mounted between the fabric layer and the layer of material, a first layer of adhesive between the first fabric layer and the flexible printed circuit, and a second layer of adhesive between the second fabric layer and flexible printed circuit.

In accordance with another embodiment, the electrical components are soldered to the flexible printed circuit and include sensors, the fabric-based item includes polymer that contains light-scattering particles and that overlaps the electrical components.

The foregoing is merely illustrative and various modifications can be made by those skilled in the art without departing from the scope and spirit of the described embodiments. The foregoing embodiments may be implemented individually or in any combination.

What is claimed is:

1. An apparatus, comprising:
   a substrate that has an array of openings;
   an array of electrical components mounted on the substrate; and a fabric layer attached to the substrate, wherein the substrate comprises a flexible printed circuit having portions to which the electrical components are attached and having segments extending between the portions to which the electrical components are attached and wherein each one of the segments has a curved portion.

2. The apparatus defined in claim 1, wherein the electrical components include light-emitting diodes.

3. The apparatus defined in claim 2, further comprising translucent polymer covering the light-emitting diodes.

4. The apparatus defined in claim 3, further comprising a layer of adhesive interposed between the fabric layer and the substrate with the array of openings.

5. The apparatus defined in claim 1, wherein the electrical components comprise actuators.

6. The apparatus defined in claim 1, wherein the electrical components comprise sensors.

7. The apparatus defined in claim 1, wherein the electrical components are soldered to the portions to which the electrical components are attached.

8. The apparatus defined in claim 1, wherein the substrate includes metal traces that route signals between the array of electrical components.

9. An apparatus, comprising:
a substrate that has an array of openings;
an array of electrical components mounted on the substrate; and
a fabric layer attached to the substrate, wherein the substrate is formed from a continuous grid of component support regions and interconnect regions that couple the component support regions, wherein each electrical component of the array of electrical components is mounted on one of the component support regions of the substrate, and wherein each one of the interconnect regions has a curved portion.

* * * * *